US012062678B2

(12) United States Patent
Huang et al.

(10) Patent No.: US 12,062,678 B2
(45) Date of Patent: Aug. 13, 2024

(54) TRENCH ISOLATION STRUCTURE FOR SCALED PIXEL REGION

(71) Applicant: Taiwan Semiconductor Manufacturing Co., Ltd., Hsinchu (TW)

(72) Inventors: Cheng Yu Huang, Hsinchu (TW); Wei-Chieh Chiang, Yuanlin Township (TW); Keng-Yu Chou, Kaohsiung (TW); Tzu-Hsuan Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 361 days.

(21) Appl. No.: 17/372,866

(22) Filed: Jul. 12, 2021

(65) Prior Publication Data

US 2022/0328535 A1    Oct. 13, 2022

Related U.S. Application Data

(60) Provisional application No. 63/174,107, filed on Apr. 13, 2021.

(51) Int. Cl.
*H01L 27/146* (2006.01)

(52) U.S. Cl.
CPC .... *H01L 27/1463* (2013.01); *H01L 27/14607* (2013.01); *H01L 27/14612* (2013.01); *H01L 27/14621* (2013.01); *H01L 27/14627* (2013.01); *H01L 27/14683* (2013.01)

(58) Field of Classification Search
CPC .......... H01L 27/1463; H01L 27/14683; H01L 27/14621; H01L 27/14607
See application file for complete search history.

(56) References Cited

U.S. PATENT DOCUMENTS

| 11,557,617 | B2 * | 1/2023 | Cho ................. H01L 27/14609 |
| 2017/0092684 | A1 | 3/2017 | Chang et al. |
| 2018/0301494 | A1 | 10/2018 | Park et al. |
| 2019/0148431 | A1 | 5/2019 | Cheng et al. |
| 2019/0252425 | A1 | 8/2019 | Ogawa |
| 2019/0378863 | A1 * | 12/2019 | Chou ................. H01L 27/14636 |
| 2021/0265416 | A1 * | 8/2021 | Chen .................. H01L 31/1892 |

* cited by examiner

*Primary Examiner* — David A Zarneke
(74) *Attorney, Agent, or Firm* — Eschweiler & Potashnik, LLC

(57) ABSTRACT

The present disclosure, in some embodiments, relates to an image sensor integrated chip. The image sensor integrated chip includes a substrate having a first side and a second side opposing the first side. The substrate has one or more sidewalls defining a trench extending along opposing sides of a pixel region having a first width. An isolation structure including one or more dielectric materials is disposed within the trench. The isolation structure has a second width. An image sensing element and a focal region are disposed within the pixel region. The focal region is configured to receive incident radiation along the second side of the substrate. A ratio of the second width to the first width is in a range of between approximately 0.1 and approximately 0.2, so that the focal region is completely confined between interior sidewall of the isolation structure facing the image sensing element.

20 Claims, 14 Drawing Sheets

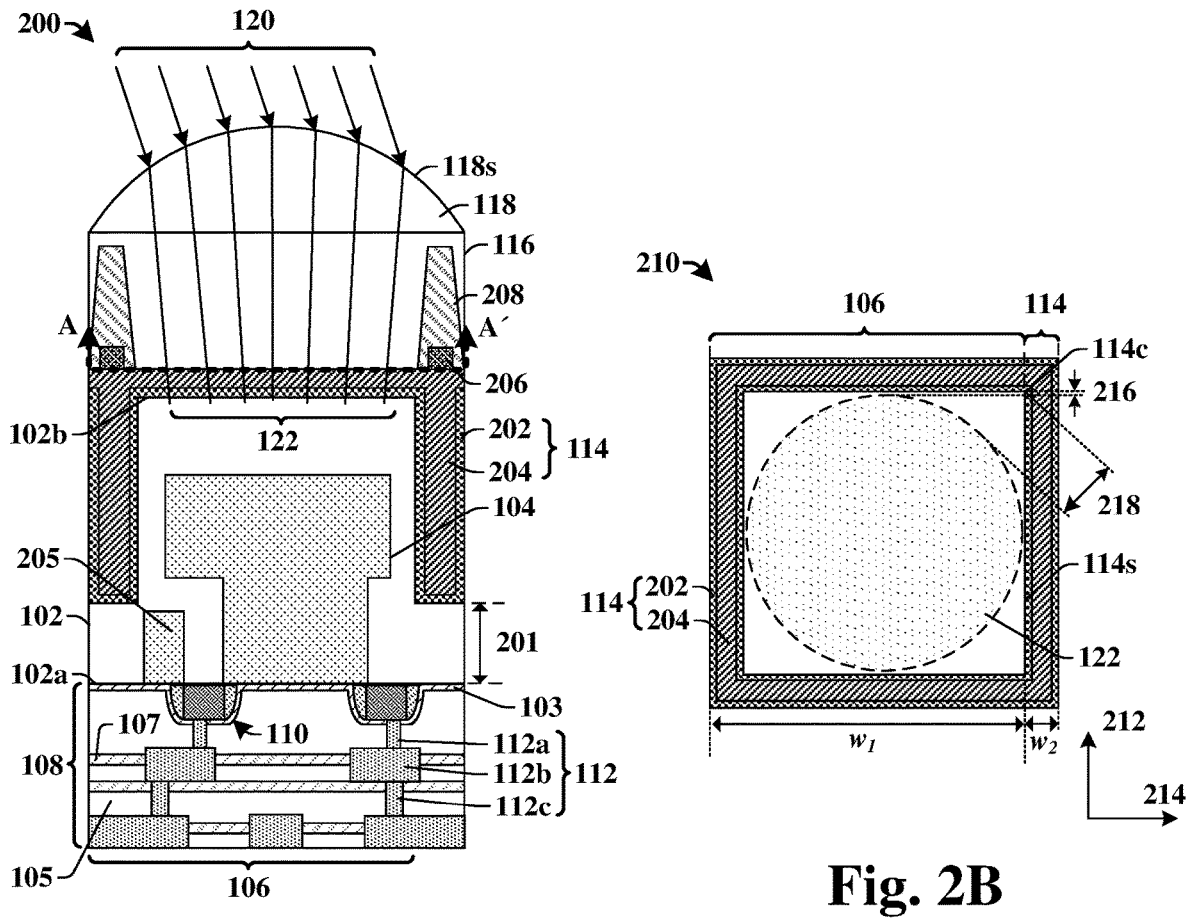
Fig. 2A
Fig. 2B
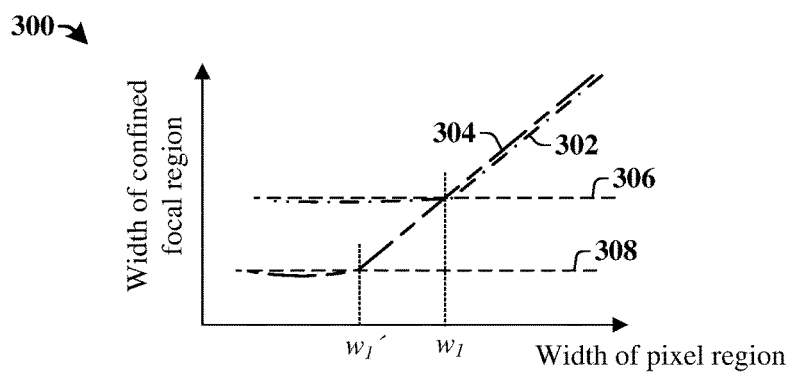
Fig. 3

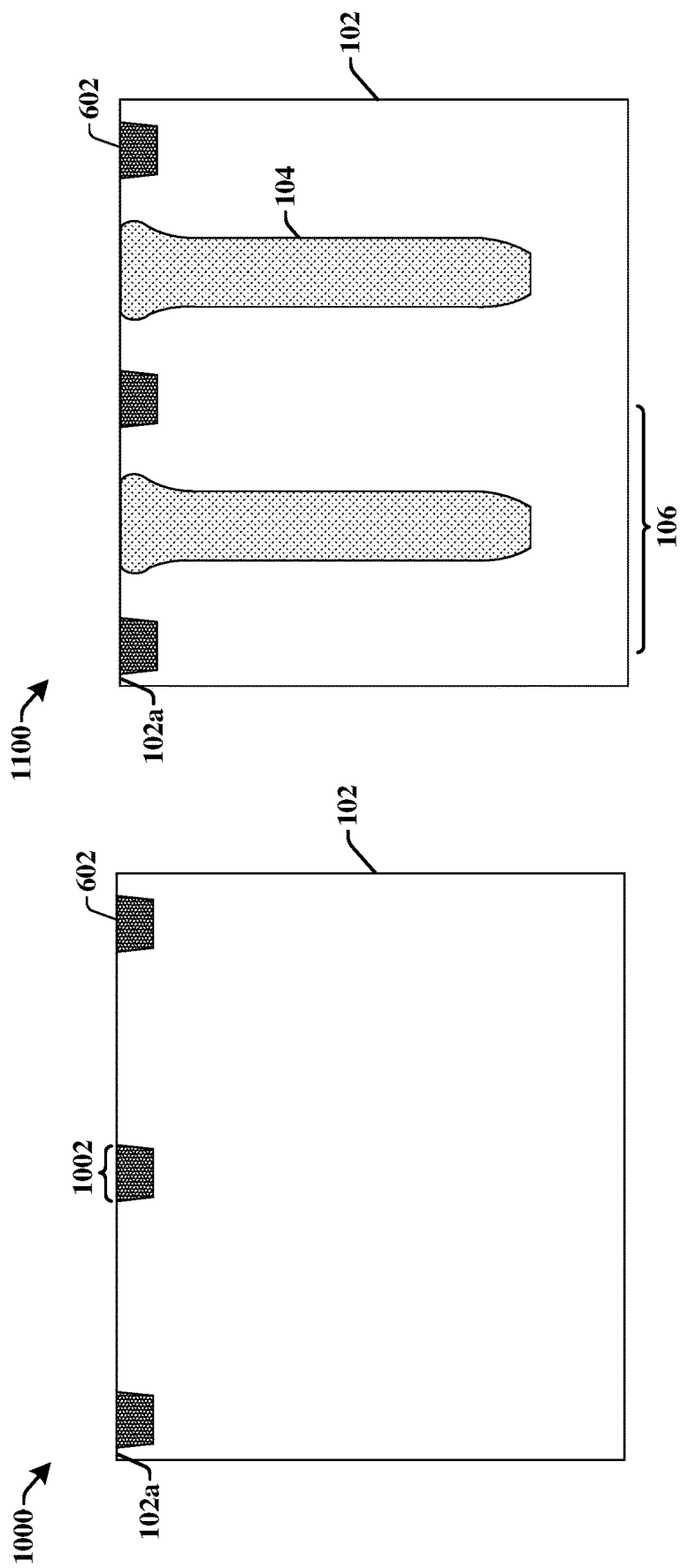

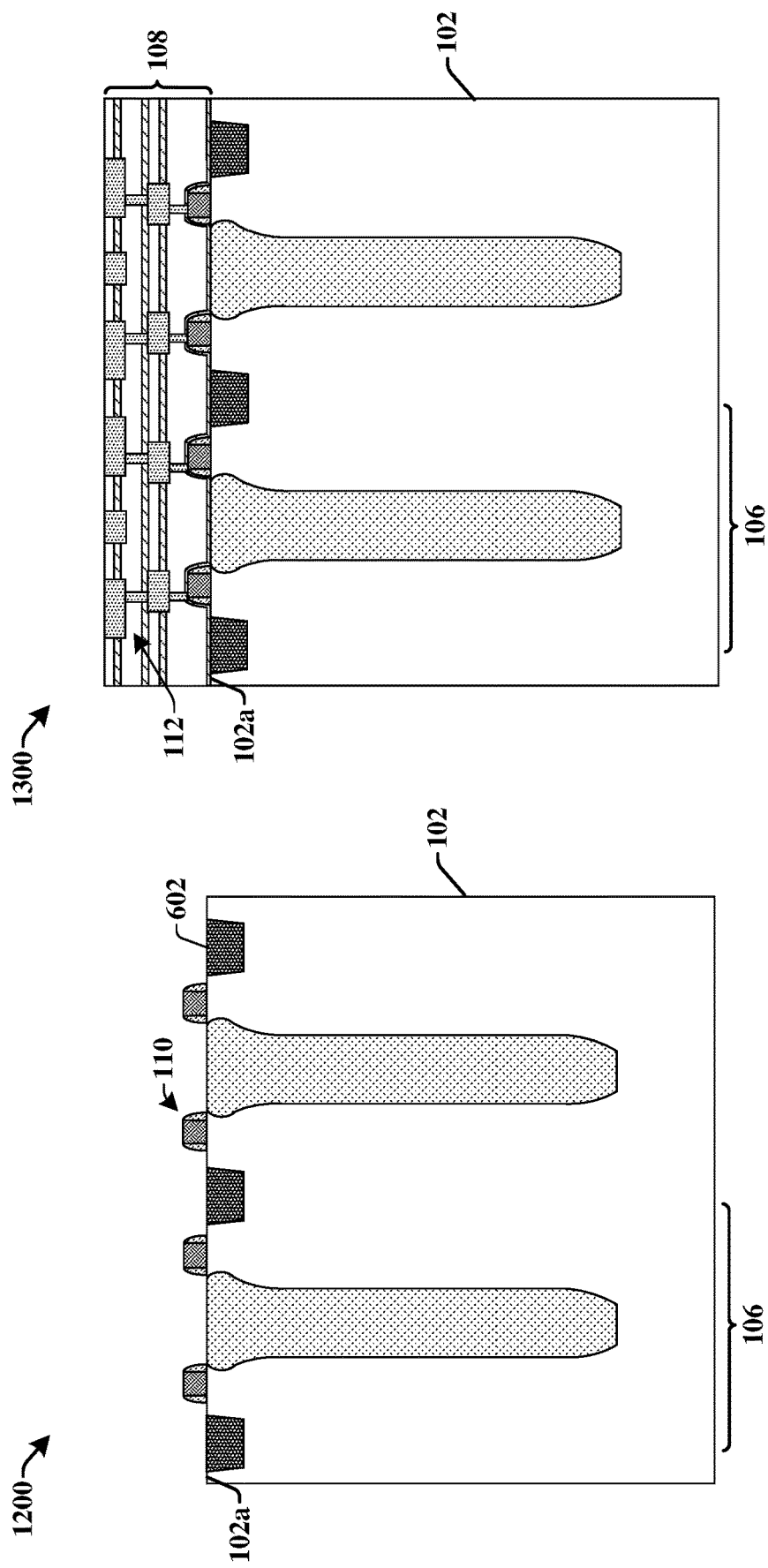

TRENCH ISOLATION STRUCTURE FOR SCALED PIXEL REGION

REFERENCE TO RELATED APPLICATION

This application claims the benefit of U.S. Provisional Application No. 63/174,107, filed on Apr. 13, 2021, the contents of which are hereby incorporated by reference in their entirety.

BACKGROUND

Integrated circuits (IC) with image sensors are used in a wide range of modern day electronic devices, such as cameras and cell phones, for example. In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B illustrate some additional embodiments of an image sensor IC comprising a disclosed isolation structure.

FIG. 3 illustrates some embodiments of a graph showing an effect of diffraction limits for different pixel sizes.

FIGS. 10-21 illustrate cross-sectional views of some embodiments of a method of forming an image sensor IC comprising a disclosed isolation structure.

DETAILED DESCRIPTION

Figure 1A:
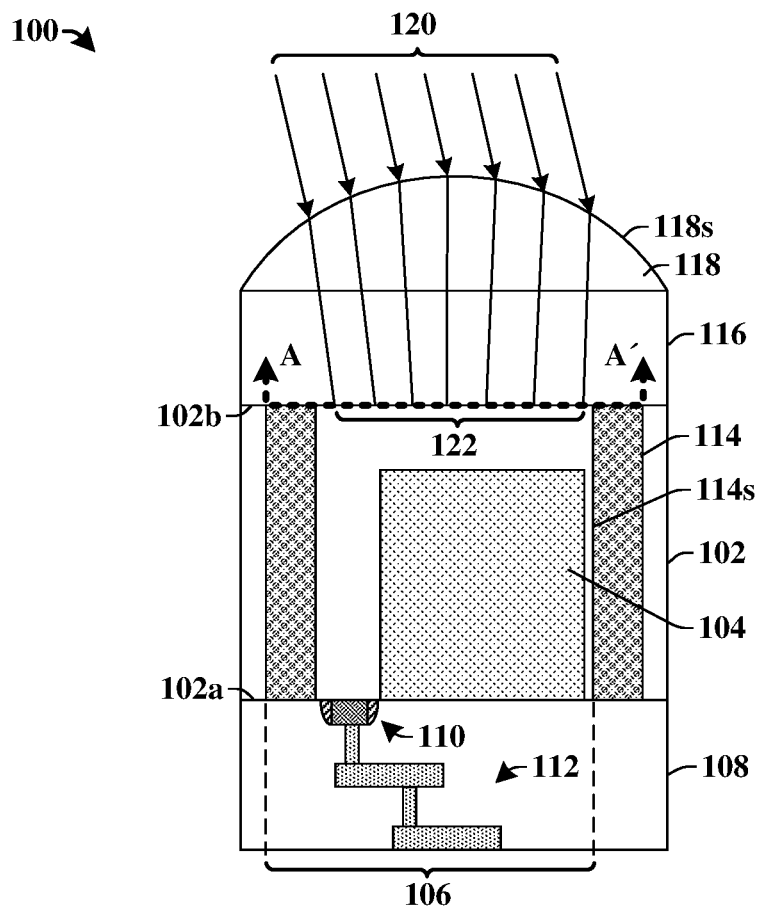
FIGS. 1A-1B illustrate some embodiments of an image sensor integrated chip (IC) comprising an isolation structure having a width that is configured to improve performance of the image sensor IC.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise a plurality of pixel regions arranged in an array. The plurality of pixel regions respectively include an image sensing element arranged within a semiconductor substrate and laterally surrounded by isolation structures that are configured to electrically isolate adjacent pixel regions. A plurality of micro-lenses are arranged over the plurality of pixel regions. The plurality of micro-lenses are respectively configured to focus incident radiation (e.g., incident light) onto an underlying image sensing element. Upon receiving the incident radiation, the image sensing element is configured to convert the incident radiation to an electric signal. The electric signal from the image sensing element can be processed by a signal processing unit to determine an image captured by the CIS.

As sizes of integrated chips scale (e.g., decrease), sizes of pixel regions within the integrated chips have also scaled (e.g., decrease). However, widths of isolation structures surrounding the pixel regions have generally not scaled, since the widths have not negatively impacted the pixel regions and since narrower isolation structures are more challenging to fabricate (e.g., in terms of etching and/or dielectric filling). It has been appreciated that as the size of a pixel region continues to decrease to a width of approximately 0.7 microns or less, a size of a focal region is unable to decrease to a size that can be confined between interior sidewalls of the isolation structure. This is because scaling of the focal region is limited by a diffraction limit of an overlying micro-lens. Furthermore, it has been appreciated that the diffraction limit of the micro-lens is difficult to change since it is a function of a numerical aperture that is constrained by a size and/or material the micro-lens. Since the size of the focal region is not easy to decrease, a focal region of a micro-lens (e.g., an area upon which the micro-lens focuses incident radiation) begins to overlap an isolation structure surrounding the pixel region. The overlap between the focal region and the isolation structure causes a smaller amount of incident radiation to reach an image sensing element within the pixel region, and thereby negatively impacts a performance of the image sensing element.

The present disclosure relates to an image sensing integrated chip (IC) comprising an isolation structure surrounding a pixel region having a width that is less than or equal to approximately 0.7 microns. The isolation structure is configured to improve a performance of an image sensing element within the pixel region. In some embodiments, the image sensor IC comprises an image sensing element disposed within a pixel region of a substrate. The substrate has one or more sidewalls defining a trench extending along opposing sides of the pixel region. An isolation structure, comprising one or more dielectric materials, is disposed within the trench. The pixel region has a first width that is less than or equal to approximately 0.7 microns, and the isolation structure has a second width that is less than the first width. A focal region, which is configured to receive incident radiation, is also disposed within the pixel region along a second side of the substrate. A ratio of the second width to the first width is in a range of between approximately 0.1 and approximately 0.2, so that the focal region is substantially confined between interior sidewalls of the isolation structure facing the image sensing element. By having a width that causes the focal region to be substantially confined between the interior sidewalls of the isolation structure, the image sensor IC is able to receive a large amount of incident radiation that causes the image sensor IC to have a good performance at pixel widths of less than or equal to approximately 0.7 microns.

Figure 1B:
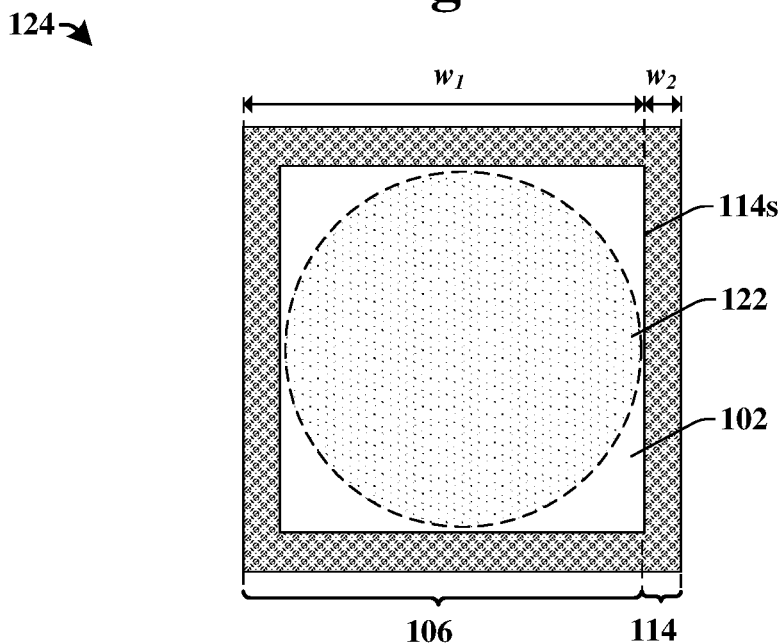

FIGS. 1A-1B illustrates some embodiments of an image sensor integrated chip (IC) 100 comprising an isolation structure having a width that is configured to improve a performance of the image sensor IC.

The image sensor IC 100, shown in the cross-sectional view of FIG. 1A, comprises a substrate 102 having a first side 102a (e.g., a front-side) and a second side 102b (e.g., a back-side) opposing the first side 102a. An image sensing element 104 is disposed within a pixel region 106 of the substrate 102. The image sensing element 104 is configured to convert incident radiation 120 to an electrical signal. One or more transistor gate structures 110 are arranged along the first side 102a of the substrate 102. In some embodiments, the one or more transistor gate structures 110 are coupled to one or more interconnects 112 disposed within a dielectric structure 108 arranged on the first side 102a of the substrate 102.

An isolation structure 114 is arranged within the substrate 102 and along opposing sides of the pixel region 106. For example, the pixel region 106 may extend from an outer sidewall of the isolation structure 114 that faces away from the image sensing element 104 to an interior sidewall of the isolation structure 114 that faces the image sensing element 104. In some embodiments, the isolation structure 114 may comprise one or more dielectric materials arranged within a trench that is defined by sidewalls of the substrate 102. In some embodiments, the isolation structure 114 extends from the second side 102b of the substrate 102 to within the substrate 102. In some additional embodiments, the isolation structure 114 may extend from the second side 102b of the substrate 102 to the first side 102a of the substrate 102.

A color filter 116 is disposed on the second side 102b of the substrate 102 and a micro-lens 118 is arranged on the color filter 116. The micro-lens 118 has a curved surface 118s facing away from the substrate 102. The curved surface 118s is configured to focus incident radiation 120 to a focal region 122 arranged along the second side 102b of the substrate 102 over the image sensing element 104. In some embodiments, the micro-lens 118 may have a numerical aperture that is in a range of between approximately 0.3 and approximately 0.75.

As shown in top-view 124 of FIG. 1B (taken along cross sectional line A-A' of FIG. 1A), the pixel region 106 has a first width $w_1$ and the isolation structure 114 has a second width $w_2$ measured along a side of the pixel region 106. In some embodiments, the first width $w_1$ may be less than or equal to approximately 0.7 microns. In some such embodiments, the second width $w_2$ of the isolation structure 114 is in a range of between approximately 10% and approximately 20% of the first width $w_1$ of the pixel region 106. In other such embodiments, a ratio between the second width $w_2$ and the first width $w_1$ is between approximately 0.1 and approximately 0.2 (e.g., $0.1 < w_2/w_1 < 0.2$). By having the second width $w_2$ of the isolation structure 114 in a range of between approximately 10% and approximately 20% of the first width $w_1$ of the pixel region 106, the isolation structure 114 takes up a small enough footprint of the pixel region 106 so that the focal region 122 can be substantially confined between interior sidewalls 114s of the isolation structure 114. By substantially confining the focal region 122 between interior sidewalls 114s of the isolation structure 114, a large amount of the incident radiation 120 reaches the image sensing element 104 and thereby increases performance of the image sensing element 104.

FIGS. 2A-2B illustrate some additional embodiments of an image sensor IC 200 comprising a disclosed isolation structure.

The image sensor IC 200, as shown in FIG. 2A, comprises a substrate 102. In various embodiments, the substrate 102 may be any type of semiconductor body (e.g., silicon, SiGe, SOI, etc.), as well as any other type of semiconductor and/or epitaxial layers, associated therewith. An image sensing element 104 is arranged within a pixel region 106 of the substrate 102. In various embodiments, the image sensing element 104 may comprise a photodiode, a phototransistor, or the like.

An isolation structure 114 is arranged within the substrate 102 and along opposing sides of the pixel region 106. The isolation structure 114 comprises one or more dielectric materials disposed within a trench in the substrate 102. In some embodiments, the trench extends from the second side 102b of the substrate 102 to within the substrate 102. In some additional embodiments, the isolation structure 114 may be separated from the first side 102a of the substrate 102 by a non-zero distance 201. In some embodiments, the isolation structure 114 may comprise a first dielectric material 202 and a second dielectric material 204 disposed on the first dielectric material 202. In some such embodiments, the first dielectric material 202 is arranged along sidewalls and a horizontally extending surface of the substrate 102, and the second dielectric material 204 is arranged along sidewalls and a horizontally extending surface of the first dielectric material 202. In some embodiments, the first dielectric material 202 may comprise a high-k dielectric material such as hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), or the like. In some embodiments, the second dielectric material 204 may comprise an oxide (e.g., silicon oxide), TEOS (tetraethyl orthosilicate), a nitride (e.g., silicon nitride, silicon oxynitride, etc.), a carbide (e.g., silicon carbide, silicon oxycarbide, etc.), or the like.

One or more transistor gate structures 110 are arranged along the first side 102a of the substrate 102 and within the pixel region 106. In various embodiments, the one or more transistor gate structures 110 may correspond to a transfer transistor, a source-follower transistor, a row select transistor, and/or a reset transistor. In some embodiments, the one or more transistor gate structures 110 may comprise a transfer gate that is configured to selectively control the movement of charge carriers between the image sensing element 104 and a floating diffusion well 205 comprising a doped region arranged within the substrate 102.

A dielectric structure 108 is also disposed along the first side 102a of the substrate 102 and covers the one or more transistor gate structures 110. The dielectric structure 108 surrounds a plurality of interconnects 112. In some embodiments, the dielectric structure 108 comprises a plurality of stacked inter-level dielectric (ILD) layers 105. In some embodiments, the plurality of interconnects 112 comprise conductive contacts 112a, interconnect wires 112b, and/or interconnect vias 112c. In some embodiments, the dielectric structure 108 may further comprise a plurality of etch stop layers 107 disposed between adjacent ones of the plurality of stacked ILD layers 105. In some additional embodiments, the dielectric structure 108 may further comprise a contact etch stop layer (CESL) 103 separating the one or more transistor gate structures 110 from a closest one of the plurality of stacked ILD layers 105.

In some embodiments, the plurality of stacked ILD layers 105 may comprise one or more of silicon dioxide, SiCOH, a fluorosilicate glass, a phosphate glass (e.g., borophosphate silicate glass), or the like. In some embodiments, the etch stop layers 107 and the CESL 103 may comprise a nitride (e.g., silicon nitride), a carbide (e.g., silicon carbide), or the like. In some embodiments, the plurality of interconnects 112 may comprise copper, tungsten, ruthenium, aluminum, and/or the like.

A grid structure 206 is disposed on the second side 102b of the substrate 102. In some embodiments, the grid structure 206 may be arranged directly over the one or more isolation structures 114. In some embodiments, the grid structure 206 may extend around the pixel region 106 along a closed path. In some embodiments, the grid structure 206 may comprise a metal, such as aluminum, cobalt, copper, silver, gold, tungsten, etc.

A dielectric material 208 may be disposed over the grid structure 206. A color filter 116 is arranged between sidewalls of the grid structure 206 and/or the dielectric material 208. The color filter 116 is configured to transmit specific wavelengths of incident radiation 120. A micro-lens 118 is arranged over the color filter 116. The micro-lens 118 is configured to focus the incident radiation 120 (e.g., light) to a focal region 122 along the second side 102b of the substrate 102. In some embodiments, the focal region 122 is confined between interior sidewalls of the isolation structure 114 that face the image sensing element 104.

In some embodiments, the color filter 116 is configured to have a different (e.g., lower) index of refraction than the dielectric material 208. The difference between the indices of refraction of the color filter 116 and the dielectric material 208 will cause the incident radiation 120 (e.g., light) to be internally refracted within the color filter 116, thereby forming a light guide structure configured to focus the incident radiation 120 onto a focal region 122. By utilizing the light guide structure to focus the incident radiation 120 onto the focal region 122, the focal region 122 can be better confined between interior sidewalls of the isolation structure 114 and cross-talk between the pixel region 106 and an adjacent pixel region (not shown) can be mitigated.

In some embodiments, the dielectric material 208 may comprise a porous dielectric material (e.g., a porous oxide) having a relatively low density (e.g., less than or equal to approximately 1.5 g/cm$^3$). In some embodiments, the color filter 116 may comprise a monomer, a polymer, or the like. In some embodiments, the color filter 116 may have an index of refraction that is greater than approximately 1.6, that is in a range of between approximately 1.5 and approximately 1.9, between approximately 1.6 and approximately 1.8, of approximately 1.7, that is approximately 1.67, approximately 1.65, or other similar values. In some embodiments, the dielectric material 208 may have a refractive index that is less than approximately 1.4, less than approximately 1.45, that is in a range of between approximately 1.0 and approximately 1.4, between approximately 1.1 and approximately 1.3, that is approximately 1.2, approximately 1.25, approximately 1.27, or other similar values.

In some embodiments, shown in top-view 210 of FIG. 2B (taken along cross sectional line A-A' of FIG. 2A), the focal region 122 may be confined between interior sidewalls 114s of the isolation structure 114 along a first direction 212 and along a second direction 214 that is perpendicular to the first direction 212. In such embodiments, the first direction 212 and the second direction 214 may be parallel to the second side 102b of the substrate 102. In some embodiments, the focal region 122 may be separated from the interior sidewalls 114s of the isolation structure 114 by a first distance 216 that is smaller than a second distance 218 between the focal region 122 and a corner 114c of the isolation structure 114 (e.g., were the interior sidewalls 114s of the isolation structure 114 meet). In some embodiments, the first distance 216 may be in a range of between approximately 0 nm (nanometers) and approximately 50 nm. In some embodiments, the second distance 218 may be in a range of between approximately 10 nm and approximately 250 nm.

In some embodiments, the pixel region 106 may have a first width $w_1$ and the isolation structure 114 may have a second width $w_2$ measured along a side of the pixel region 106. In some embodiments, the first width $w_1$ may be less than approximately 0.7 microns, less than approximately 0.5 microns, or other similar values. In some embodiments, the second width $w_2$ may be less than or equal to approximately 140 nm, in a range of between approximately 70 nm and approximately 140 nm, between approximately 50 nm and approximately 70 nm, or other similar values. It has been appreciated that if the second width $w_2$ is less than approximately 50 nm that the isolation structure 114 may fail to provide for sufficient electrical isolation between the pixel region 106 and an adjacent pixel region (not shown).

FIG. 3 illustrates some embodiments of a graph 300 showing an effect of diffraction limits for different pixel widths. The graph 300 illustrates a width of a pixel region along an x-axis and a width of a confined focal region (e.g., a width of a focal region that is confined between interior sidewalls of an isolation structure) along a y-axis.

As shown in graph 300, when the width of the pixel region is large (e.g., greater than a first width $w_1$) the width of the focal region can be reduced and still be confined between interior sidewalls of an isolation structure. Line 302 illustrates a width of the focal region within the substrate for a convention isolation structure (e.g., an isolation structure having a width that is greater than 20% of the width of the pixel region). As shown by line 302, as a width of the pixel region shrinks below a first width $w_1$ (e.g., having a width of approximately 0.7 microns), a diffraction limit 306 of an overlying micro-lens limits a how small a width of the focal region can become. Because the width of the focal region can no longer shrink, a width of the pixel region cannot further shrink below the first width $w_1$ without resulting in a loss of performance for an associated image sensing element.

Line 304 shows a width of a focal region for a disclosed isolation structure having a relative small width that is less than or equal to approximately than 20% of a width of a pixel region. As shown by line 304, as a width of a pixel region shrinks below the first width $w_1$ (e.g., approximately 0.7 microns), the focal region is able to further scale before being limited by a diffraction limit 308 (e.g., a diffraction limit having a same size as diffraction limit 306). This is because the relatively small width of the isolation structure allows for the focal region to have more area between the interior sidewalls of the isolation structure. As shown by line 304, because the focal region is able to remain confined between interior sidewalls of an isolation structure, a width of the pixel region is able to be reduced to a smaller width $w_1'$ before being limited by the diffraction limit 308 of an overlying micro-lens. Therefore, the disclosed isolation structure allows for a performance of the image sensing element to be maintained as widths of pixel regions shrink to a width $w_1'$ that is below 0.7 microns.

Figure 4:
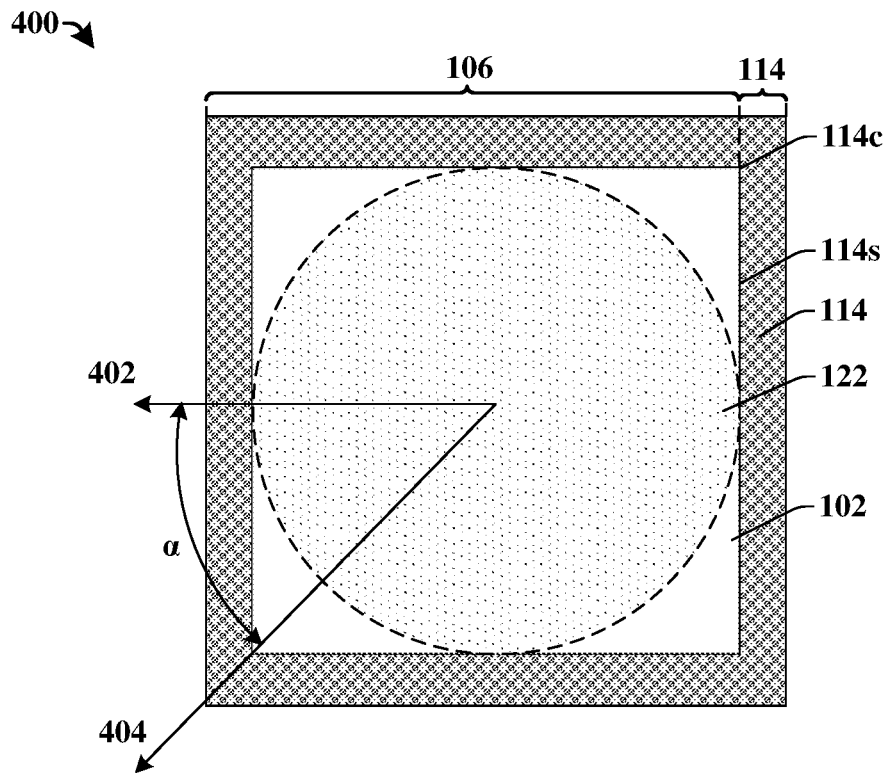
FIGS. 4-5 illustrate top-views of some additional embodiments of image sensor integrated chips (ICs) comprising a disclosed isolation structure.

FIG. 4 illustrates a top-view of some additional embodiments of an image sensor IC 400 comprising a disclosed isolation structure.

The image sensor IC 400 comprises a substrate 102 having a pixel region 106 surrounded by an isolation structure 114. A focal region 122 is arranged within the pixel region 106. The focal region 122 extends to opposing interior sidewalls 114s of the isolation structure 114, so that the focal region 122 has an outer boundary touching the isolation structure 114. In some embodiments, the focal region 122 may be completely confined between the opposing interior sidewalls 114s of the isolation structure 114.

In some embodiments, the focal region 122 may be separated from a corner 114c of the isolation structure 114 at which the interior sidewalls 114s meet. In such embodiments, the isolation structure 114 is closer to the focal region 122 along a first direction 402 than along a second direction 404 that is rotated at an angle α, which is equal to approximately 45°, with respect to the first direction 402.

Figure 5:
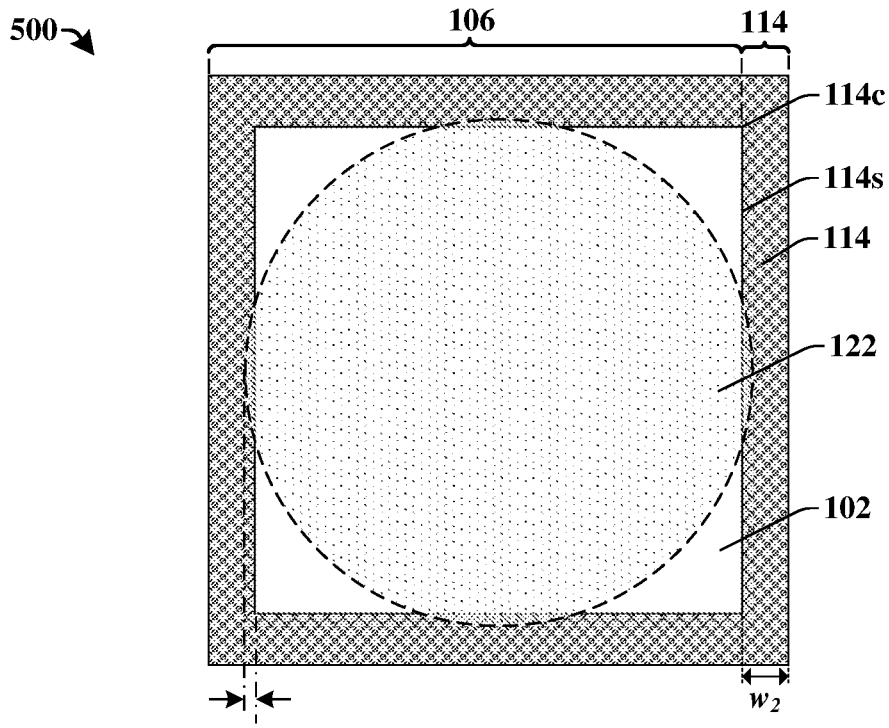

FIG. 5 illustrates a top-view of some additional embodiments of an image sensor IC 500 comprising a disclosed isolation structure.

The image sensor IC 500 comprises a substrate 102 having a pixel region 106 surrounded by an isolation structure 114. A focal region 122 is arranged within the pixel region 106. The focal region 122 extends from between interior sidewalls 114s of the isolation structure 114 to past the interior sidewalls 114s of the isolation structure 114, so that the focal region 122 overlaps the isolation structure 114. In some embodiments, the focal region 122 may extend a non-zero distance 502 past the interior sidewalls 114s of the isolation structure 114. In some embodiments, the non-zero distance 502 may be in a range of between 1% and approximately 10% of a second width $w_2$ of the isolation structure 114. By having the non-zero distance 502 less than 10% of the second width $w_2$, a performance of the image sensor IC 500 remains good. In some such embodiments, the focal region 122 may be separated from a corner 114c of the isolation structure 114 at which the interior sidewalls 114s meet.

Figure 6:
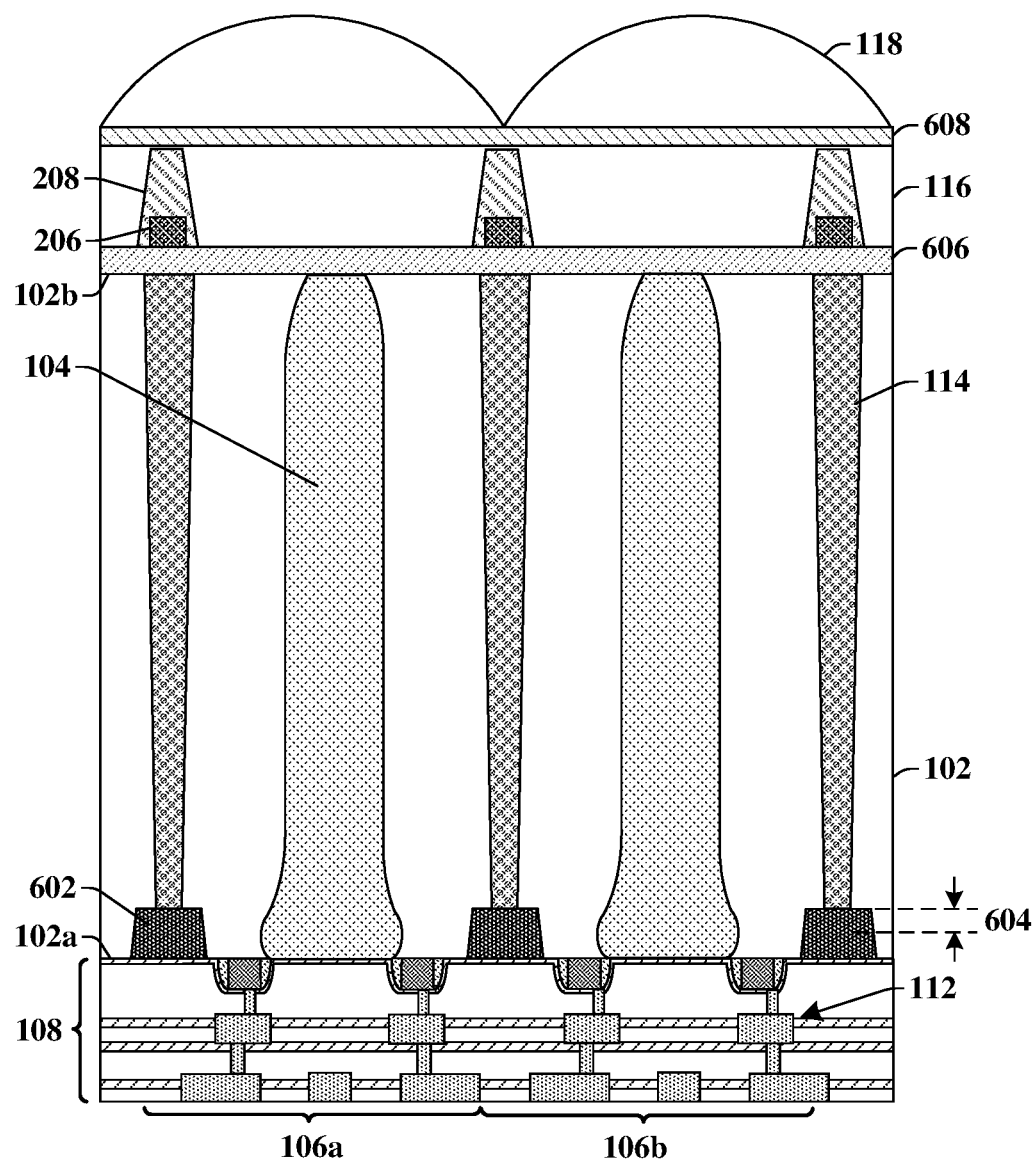
FIGS. 6-9 illustrate cross-sectional views of some additional embodiments of image sensor ICs comprising a disclosed isolation structure.

FIG. 6 illustrates a cross-sectional view of some additional embodiments of an image sensor IC 600 comprising a disclosed isolation structure.

The image sensor IC 600 comprises a substrate 102 having a first side 102a and a second side 102b. A dielectric structure 108 surrounding a plurality of interconnects 112 is arranged along the first side 102a of the substrate 102. In some embodiments, a light transmission structure 606 may be arranged along the second side 102b of the substrate 102. The light transmission structure 606 is configured to improve absorption of incident radiation into the substrate 102. In some embodiments, the light transmission structure 606 may comprise a multi-layer structure. For example, the light transmission structure 606 may comprise three or more layers of different materials. In some embodiments, the light transmission structure 606 may comprise one or more of tantalum pentoxide ($Ta_2O_5$), aluminum oxide ($Al_2O_3$), silicon dioxide ($SiO_2$), hafnium oxide (HfO), and/or the like.

A grid structure 206 is arranged on the light transmission structure 606, and a dielectric material 208 is arranged on the grid structure 206. A color filter 116 disposed between sidewalls of the grid structure 206 and/or the dielectric material 208. In some embodiments, a planarization structure 608 is arranged over the color filter 116. The planarization structure 608 has a substantially flat upper surface facing away from the substrate 102. In some embodiments, the planarization structure 608 may comprise a polymer, such as polymethyl methacrylate (PMMA), polypropylene (PP), epoxide resin (EP), polycarbonate (PC), or the like. A micro-lens 118 is arranged on the substantially flat upper surface of the planarization structure 608.

One or more shallow trench isolation (STI) structures 602 are arranged along the first side 102a of the substrate 102. One or more isolation structures 114 are arranged along the second side 102b of the substrate 102 over the one or more STI structures 602. In some embodiments, the one or more isolation structures 114 respectively have a second width that decreases as a distance from the second side 102b of the substrate 102 increases. In some such embodiments, the one or more isolation structures 114 respectively have a smaller width along a first surface facing the one or more STI structures 602 than along an opposing second surface.

In some embodiments, the one or more isolation structures 114 may extend to within the one or more STI structures 602, so that the one or more isolation structures 114 extend along sidewalls of the one or more STI structures 602. In some embodiments, the one or more isolation structures 114 may extend to within the one or more STI structures 602 to a depth 604. In some embodiments, the depth 604 may be in a range of between approximately 10 microns and approximately 50 microns.

By having the one or more isolation structures 114 extend to within the one or more STI structure 602, the one or more isolation structures 114 are able to provide for improved isolation between adjacent ones of a plurality of pixel regions 106a-106b. The improved isolation may be able to compensate for any reduction in electrical isolation resulting from a relatively small width of the isolation structure 114 (e.g., a width that is between approximately 10% and approximately 20% of a width of an associated one of the plurality of pixel regions 106a-106b).

Figure 7:
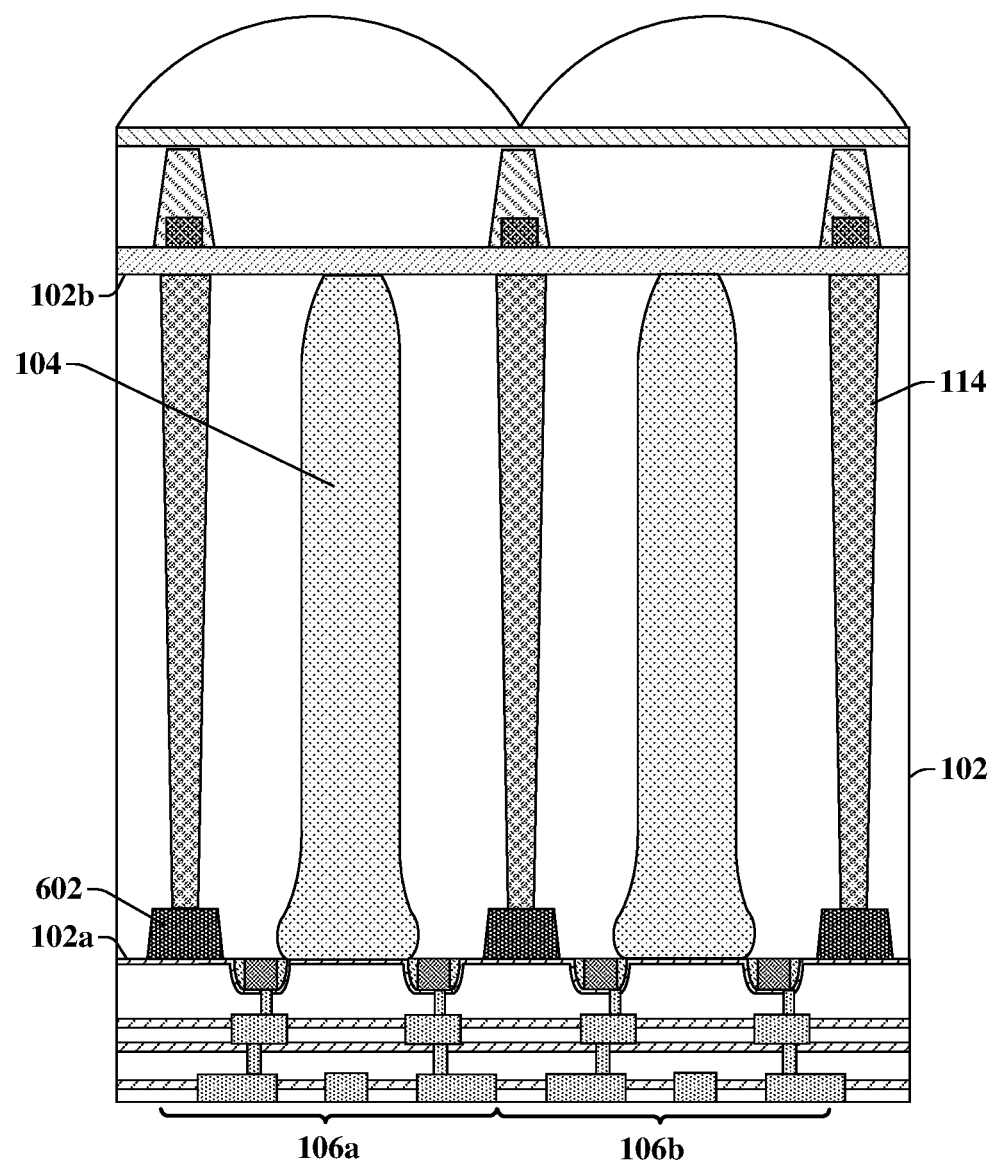

FIG. 7 illustrates a cross-sectional view of some additional embodiments of an image sensor IC 700 comprising a disclosed isolation structure.

The image sensor IC 700 comprises one or more isolation structures 114 arranged along a second side 102b of a substrate 102 over one or more STI structures 602 arranged along a first side 102a of the substrate 102. In some embodiments, the one or more isolation structures 114 may physically contact a horizontally extending surface of the one or more STI structures 602. By having the one or more isolation structures 114 physically contact a horizontally extending surface of the one or more STI structures 602, good isolation between adjacent ones of a plurality of pixel regions 106a-106b can be achieved. Furthermore, by having the one or more isolation structures 114 remain above the one or more STI structures 602, a depth of the one or more isolation structures 114 is reduced in comparison to the one or more isolation structures shown in FIG. 6. Reducing the depth of the one or more isolation structures 114 allows for the one or more isolation structures 114 to be more easily fabricated and a critical dimension (CD) of the one or more isolation structures 114 to be better controlled.

Figure 8:
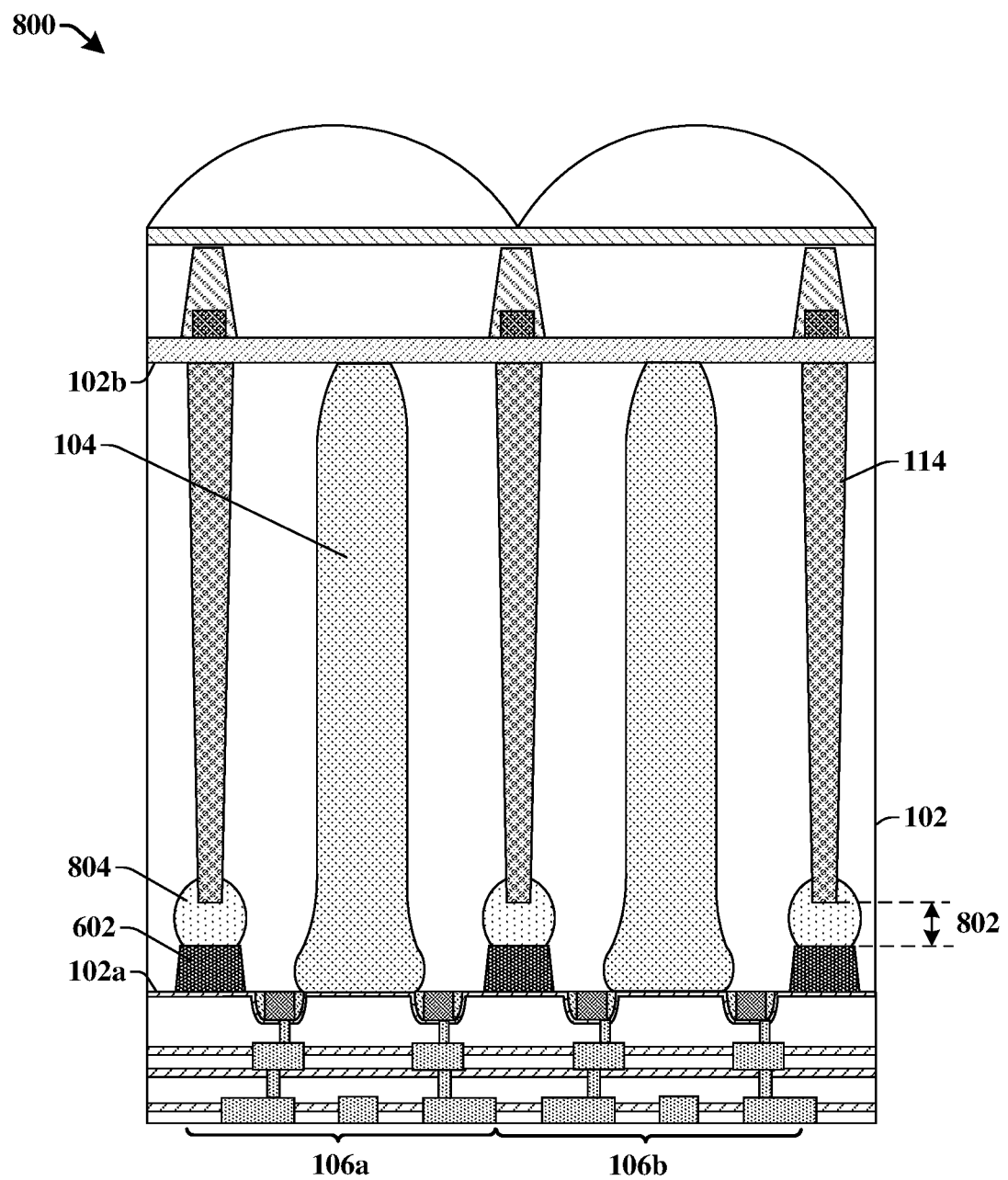

FIG. 8 illustrates a cross-sectional view of some additional embodiments of an image sensor IC 800 comprising a disclosed isolation structure.

The image sensor IC 800 comprises one or more isolation structures 114 arranged along a second side 102b of a substrate 102 over one or more STI structures 602 arranged along a first side 102a of the substrate 102. In some embodiments, the one or more isolation structures 114 may be vertically separated from the one or more STI structures 602 by the substrate 102. In some embodiments, the one or more isolation structures 114 may be vertically separated from the one or more STI structures 602 by a non-zero distance 802. In some embodiments, the non-zero distance 802 may be in a range of between approximately 5 microns and approximately 100 microns, between approximately 10 microns and approximately 50 microns, or other similar values. In some embodiments, one or more doped isolation regions 804 may be arranged within the substrate 102 between the one or more STI structures 602 and the one or more isolation structures 114 to improve electrical isolation between adjacent ones of a plurality of pixel regions 106a-106b.

By having the one or more isolation structures 114 separated from the one or more STI structures 602 by the non-zero distance 802, a depth of the one or more isolation structures 114 is reduced in comparison to the one or more isolation structures shown in FIGS. 6-7. Reducing the depth of the one or more isolation structures 114 allows for the one or more isolation structures 114 to be more easily fabricated and a CD of the one or more isolation structures 114 to be better controlled.

Figure 9:
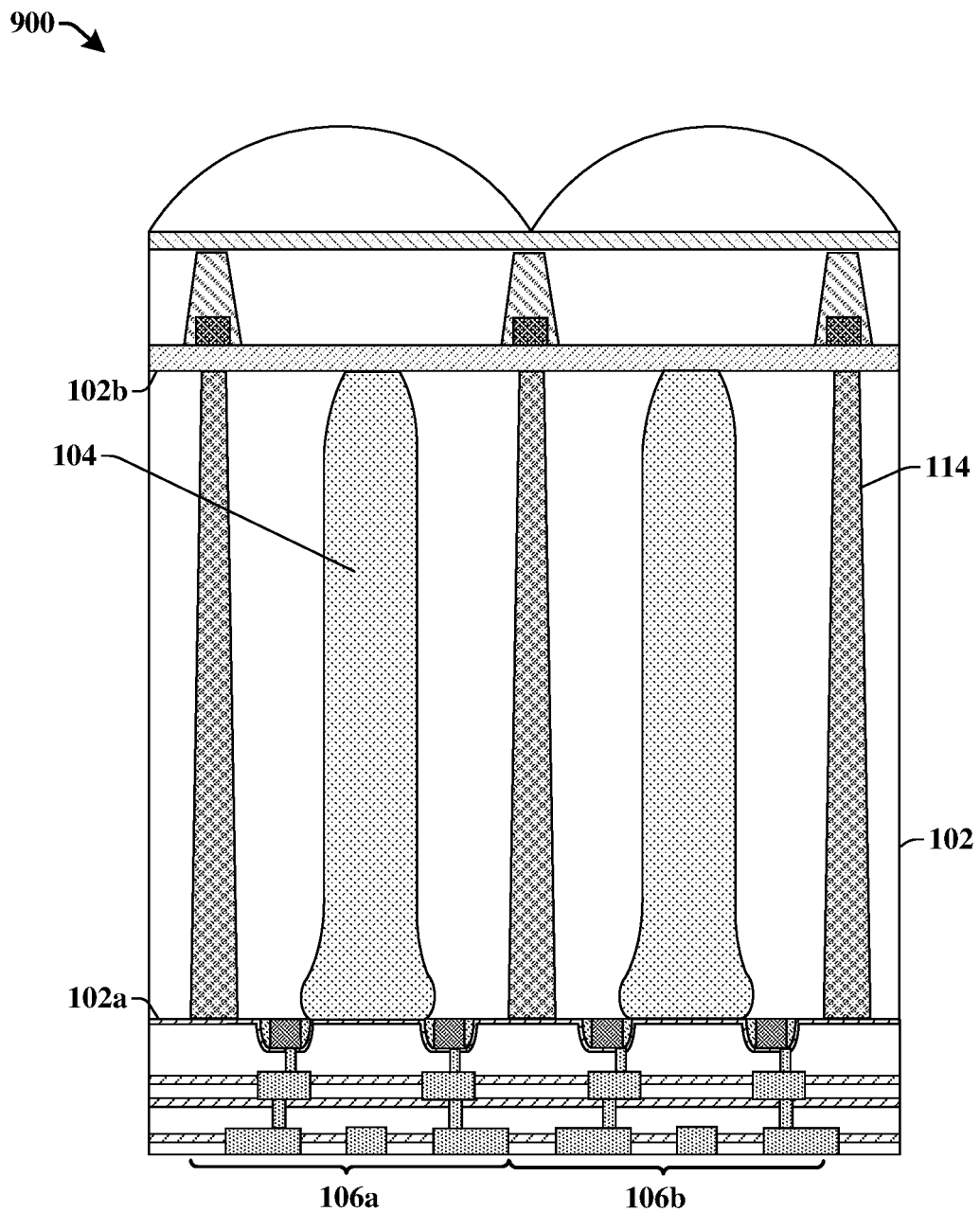

FIG. 9 illustrates a cross-sectional view of some additional embodiments of an image sensor IC 900 comprising a disclosed isolation structure.

The image sensor IC 900 comprises one or more isolation structures 114 extending from a first side 102a of a substrate 102 to a second side 102b of the substrate 102. In some embodiments, the one or more isolation structures 114 respectively have a width that increases as a distance from the second side 102b of the substrate 102 increases. In such embodiments, the one or more isolation structures 114 have a first surface proximate to the first side 102a of the substrate 102 that has larger width than a second surface proximate to a second side 102b of the substrate 102. Because the second surface of the one or more isolation structures 114 is smaller than the first surface, a CD of the one or more isolation structures 114 is able to be better controlled along the second side 102b of the substrate 102 while maintaining a relatively simple fabrication process due to a larger CD along the first side 102a of the substrate 102.

FIGS. 10-21 illustrate cross-sectional views 1000-2100 of some embodiments of a method of forming an image sensor IC comprising an isolation structure that is configured to improve performance of the image sensor IC. Although the cross-sectional views 1000-2100 shown in FIGS. 10-21 are described with reference to a method of forming an image sensor integrated chip comprising an isolation structure, it will be appreciated that the structures shown in FIGS. 10-21 are not limited to the method of formation but rather may stand alone separate of the method.

As shown in cross-sectional view 1000 of FIG. 10, one or more shallow trench isolation (STI) structures 602 are formed within a first side 102a of a substrate 102. In various embodiments, the substrate 102 may be any type of semiconductor body (e.g., silicon, SiGe, SOI, etc.), as well as any other type of semiconductor, epitaxial, dielectric, or metal layers, associated therewith. In some embodiments, the one or more STI structures 602 may be formed by selectively etching the substrate 102 to form a trench 1002. One or more dielectric materials are subsequently formed within the trench 1002. In various embodiments, the substrate 102 may be selectively etched by a wet etchant (e.g., hydrofluoric acid, potassium hydroxide, or the like) and/or a dry etchant (e.g., having an etching chemistry comprising fluorine, chlorine, or the like). In various embodiments, the one or more dielectric materials may comprise an oxide, a nitride, a carbide, or the like.

In some additional embodiments, the one or more STI structures 602 may be formed by using a thermal process to form a pad oxide over the substrate 102, followed by the formation of a nitride film over the pad oxide. The nitride film is subsequently patterned (e.g., using a photosensitive material, such as photoresist), and the pad oxide and substrate 102 are patterned according to the nitride film to form the trench 1002 within the substrate 102. The trench 1002 is then filled with one or more dielectric materials, followed by a planarization process (e.g., a chemical mechanical planarization process) to expose a top of the nitride film and an etch to remove the nitride film.

As shown in cross-sectional view 1100 of FIG. 11, an image sensing element 104 is formed within a pixel region 106 of the substrate 102. In some embodiments, the image sensing element 104 may comprise a photodiode formed by implanting one or more dopant species into the first side 102a of the substrate 102. For example, the image sensing element 104 may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

As shown in cross-sectional view 1200 of FIG. 12, one or more transistor gate structures 110 are formed along a first side 102a of a substrate 102 within the pixel region 106. In various embodiments, the one or more transistor gate structures 110 may correspond to a transfer transistor, a source-follower transistor, a row select transistor, and/or a reset transistor. In some embodiments, the one or more transistor gate structures 110 may be formed by depositing a gate dielectric film and a gate electrode film on the first side 102a of the substrate 102. The gate dielectric film and the gate electrode film are subsequently patterned to form a gate dielectric layer and a gate electrode. Sidewall spacers may be formed on the outer sidewalls of the gate electrode. In some embodiments, the sidewall spacers may be formed by depositing a spacer layer (e.g., a nitride, an oxide, etc.) onto the first side 102a of the substrate 102 and selectively etching the spacer layer to form the sidewall spacers.

As shown in cross-sectional view 1300 of FIG. 13, a plurality of interconnects 112 are formed within a dielectric structure 108 formed along the first side 102a of the substrate 102. The dielectric structure 108 comprises a plurality of stacked ILD layers, while the plurality of interconnects 112 comprise alternating layers of conductive wires and vias. In some embodiments, one or more of the plurality of interconnects 112 may be formed using a damascene process (e.g., a single damascene process or a dual damascene process). The damascene process is performed by forming an ILD layer over the first side 102a of the substrate 102, etching the ILD layer to form a via hole and/or a trench, and filling the via hole and/or trench with a conductive material.

In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the conductive material may comprise tungsten, copper, aluminum, copper, or the like.

Figure 14:
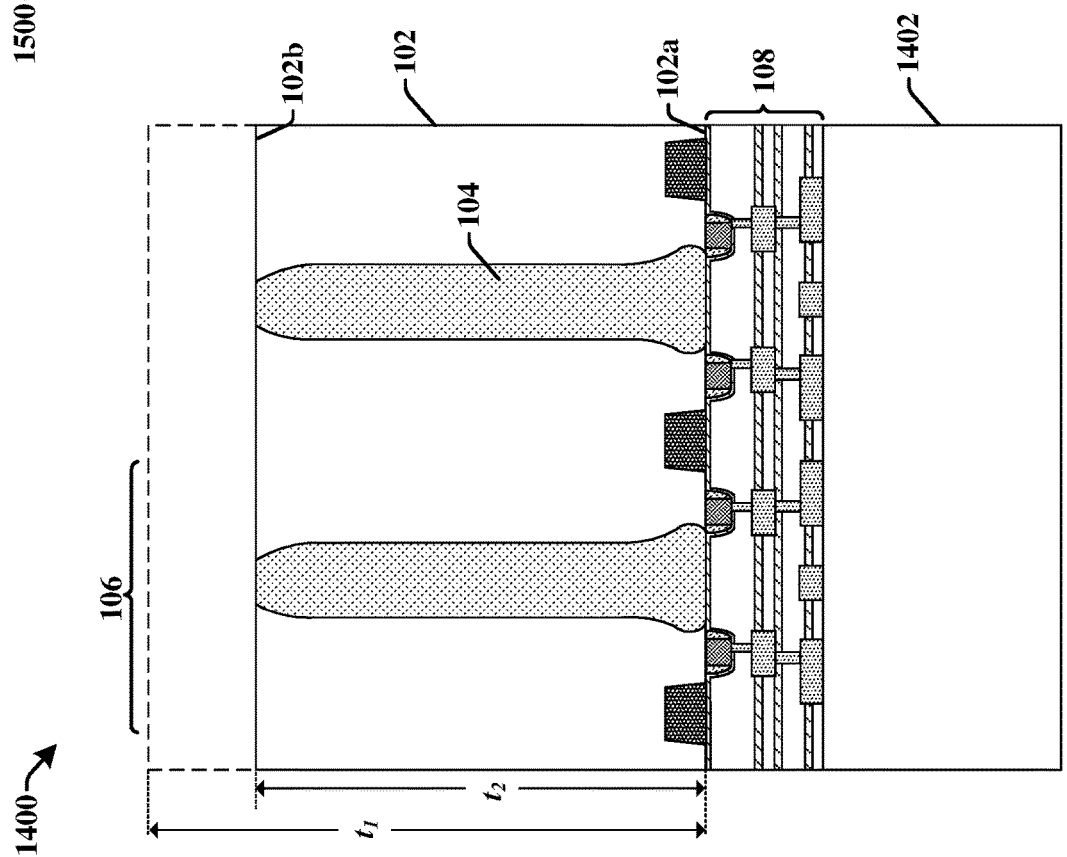

As shown in cross-sectional view 1400 of FIG. 14, the dielectric structure 108 may be bonded to a support substrate 1402. In some embodiments, the support substrate 1402 may comprise a semiconductor material, such as silicon, for example. After bonding the dielectric structure 108 to the support substrate 1402, the substrate 102 may be thinned. Thinning the substrate 102 reduces a thickness of the substrate 102 from a first thickness $t_1$ to a second thickness $t_2$ that is less than the first thickness $t_1$. Thinning the substrate 102 allows for radiation to pass more easily to the image sensing element 104. In various embodiments, the substrate 102 may be thinned by etching and/or mechanical grinding a second side 102b of the substrate 102.

Figure 15:
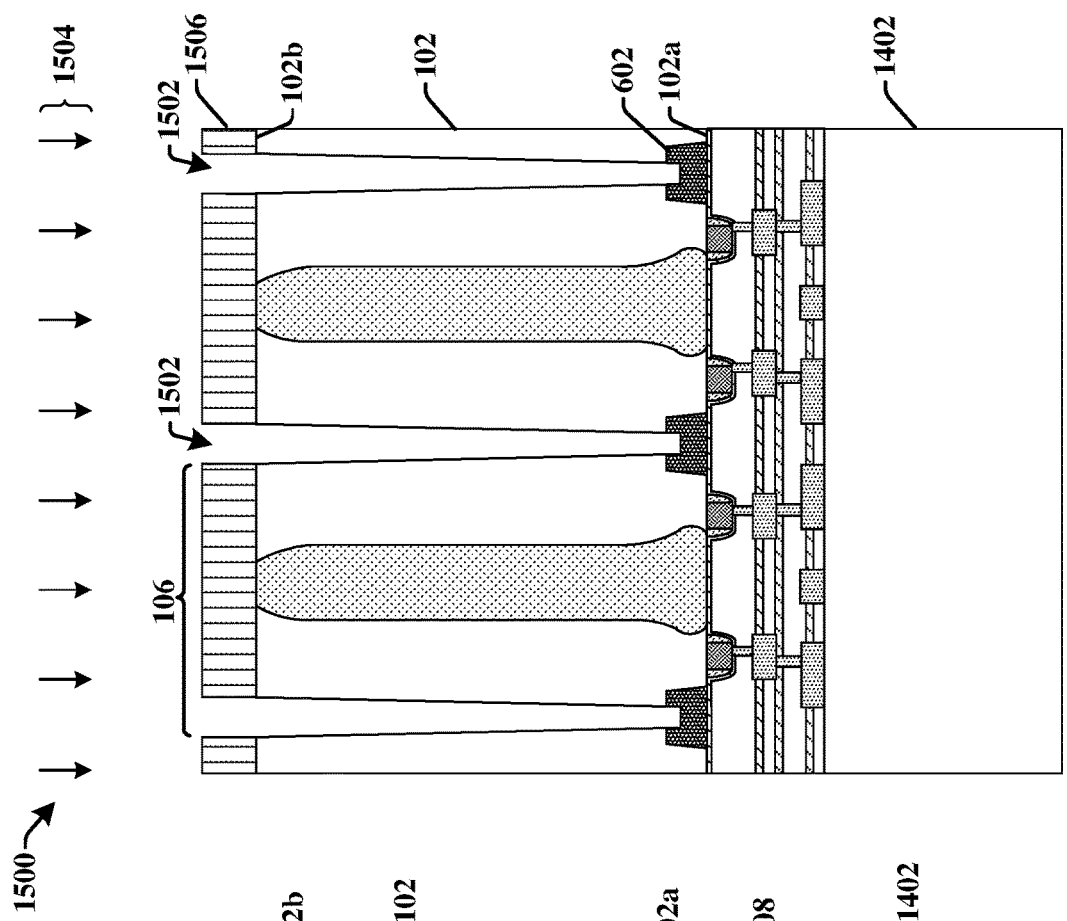

As shown in cross-sectional view 1500 of FIG. 15, one or more trenches 1502 are formed within the second side 102b of the substrate 102. The one or more trenches 1502 vertically extend from the second side 102b of the substrate 102 to within the substrate 102 along opposing sides of the pixel region 106. The pixel region 106 has a first width $w_1$ that is less than or equal to approximately 0.7 microns, and the isolation structure 114 has a second width $w_2$ that is smaller than the first width $w_1$. A ratio between the second width $w_2$ and the first width $w_1$ is in a range of between approximately 0.1 and approximately 0.2.

In some embodiments, the one or more trenches 1502 may be formed by selectively etching the second side 102b of the substrate 102. In some embodiments, the second side 102b of the substrate 102 may be selectively etched by exposing the second side 102b of the substrate 102 to one or more etchants 1504 according to a patterned masking layer 1506. In some embodiments, the patterned masking layer 1506 may comprise a photoresist, a hard mask, or the like. In some embodiments, the one or more etchants 1504 may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.).

Figures 16, 17:
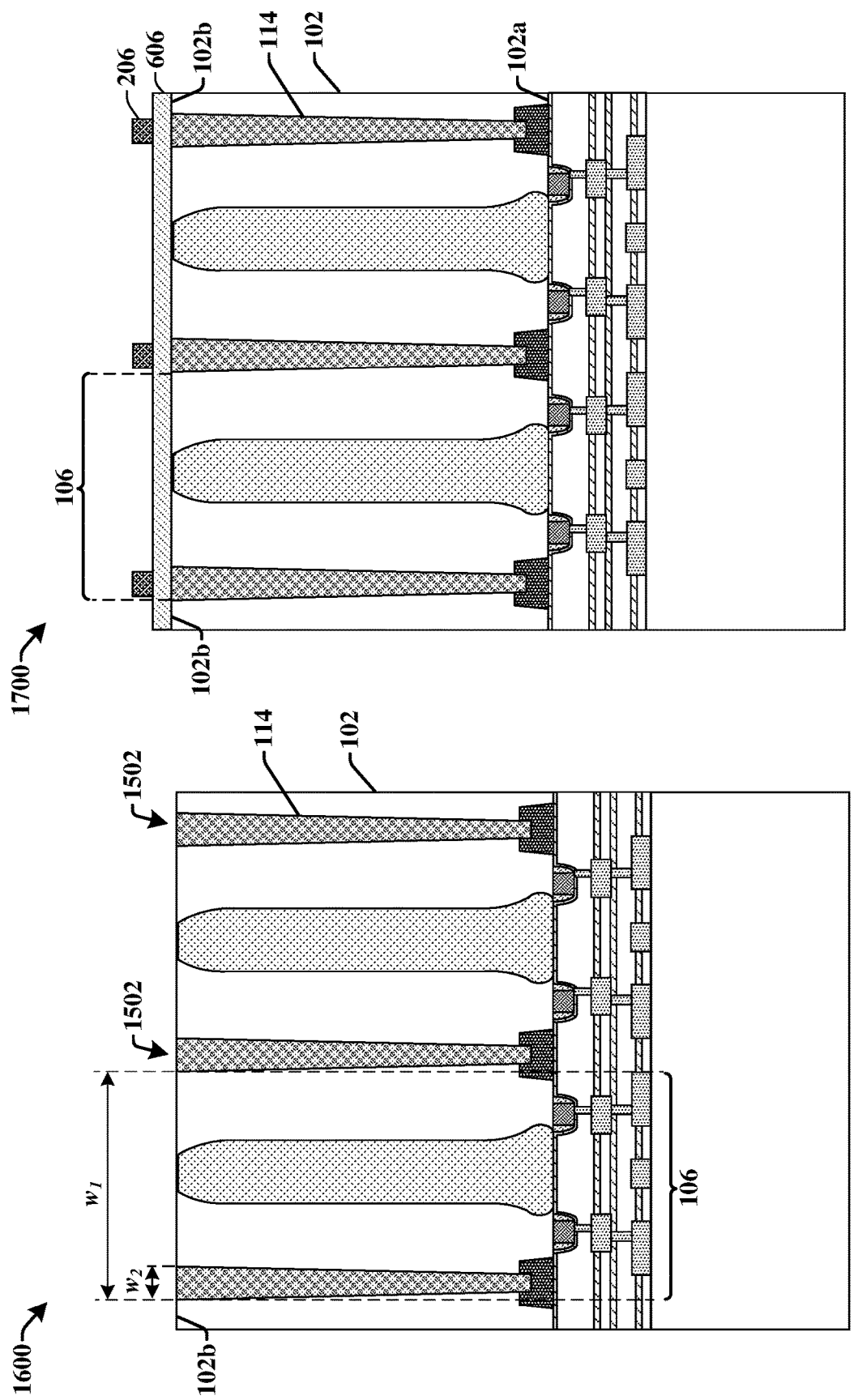

As shown in cross-sectional view 1600 of FIG. 16, one or more dielectric materials are formed within the trenches 1502 to form an isolation structure 114 on opposing sides of the pixel region 106. In some embodiments, the one or more dielectric materials may be formed to line interior surface of the substrate 102 defining the one or more trenches 1502 and to further cover the second side 102b of the substrate 102. In some such embodiments, after forming the one or more dielectric materials, a planarization process (e.g., a chemical mechanical planarization (CMP) process) may be performed to remove the one or more dielectric materials from the second side 102b of the substrate 102. In some embodiments, the one or more dielectric materials may be formed by way of a vapor deposition process (e.g., a chemical vapor deposition (CVD) process, a plasma enhanced CVD process, or the like). In other embodiments, the one or more dielectric materials may be formed by way of an atomic layer deposition (ALD) process. The ALD process can improve fill of the one or more trenches 1502, which may be otherwise difficult to fill due to a relatively large depth and small width (e.g., a width of between approximately 10% and approximately 20% of a width of the pixel region 106).

As shown in cross-sectional view 1700 of FIG. 17, a light transmission structure 606 may be formed along the second side 102b of the substrate 102. The light transmission structure 606 is configured to improve absorption of incident radiation into the substrate 102. In some embodiments, the light transmission structure 606 may comprise a multi-layer structure. For example, the light transmission structure 606 may comprise three layers of different materials. In some embodiments, the light transmission structure 606 may comprise one or more of tantalum pentoxide ($Ta_2O_5$), aluminum oxide ($Al_2O_3$), silicon dioxide ($SiO_2$), hafnium oxide (HfO), and/or the like. In some embodiments, the light transmission structure 606 may be formed by one or more deposition processes (e.g., CVD, ALD, PE-CVD, etc.)

Figure 18:
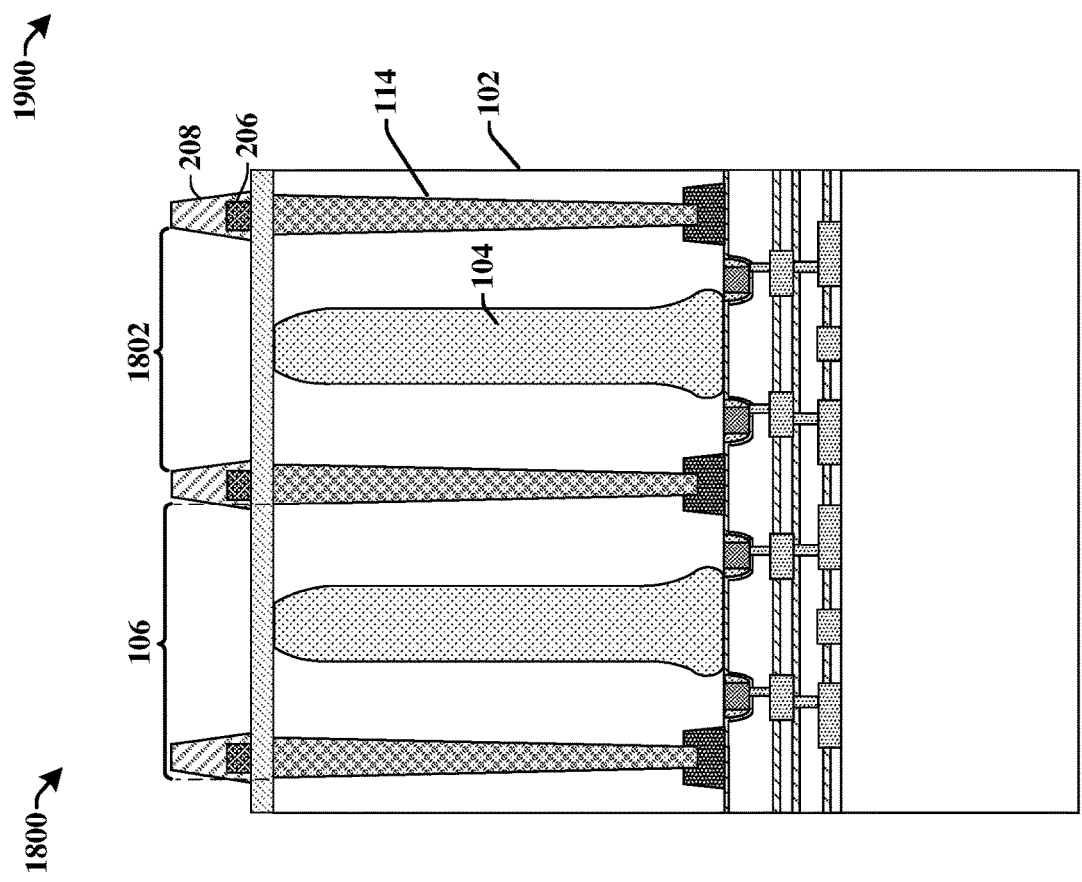

As shown in cross-sectional view 1800 of FIG. 18, a grid structure 206 is formed over the light transmission structure 606. In some embodiments, the grid structure 206 continuously extends in a closed loop around the pixel region 106. In some embodiments, the grid structure 206 may comprise a metal. In other embodiments, the grid structure 206 may comprise a dielectric material. In some embodiments, the grid structure 206 may be formed by depositing a grid material onto the light transmission structure 606 and subsequently patterning the grid material to define the grid structure 206.

In some embodiments, a dielectric material 208 may be formed over the grid structure 206. The dielectric material 208 comprises sidewalls that define a first opening 1802 that overlies the image sensing element 104. In some embodiments, the dielectric material 208 may comprise an index of refraction that is greater than approximately 1.4, greater than approximately 1.45, greater than approximately 1.5, or other similar values. The dielectric material 208 may be formed by depositing a dielectric layer onto the grid structure 206 and the light transmission structure 606 and subsequently patterning the dielectric layer.

Figure 19:
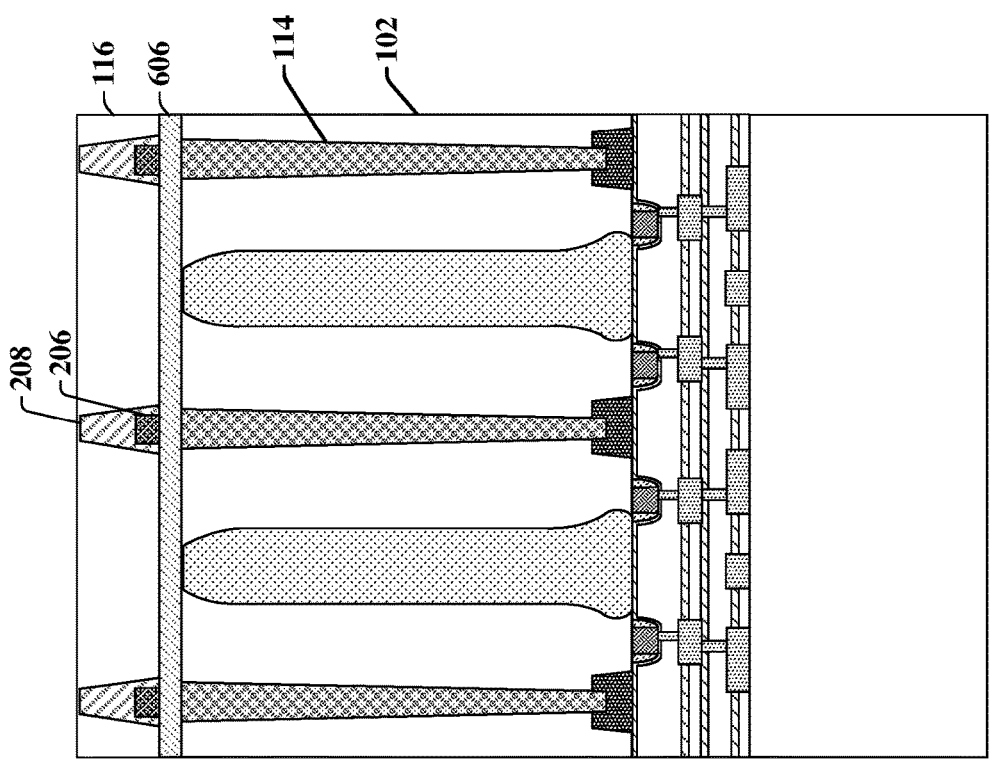

As shown in cross-sectional view 1900 of FIG. 19, a color filter 116 is formed over the light transmission structure 606 and between the sidewalls of the grid structure 206. In some embodiments, the color filter 116 may be formed by forming a color filter layer and patterning the color filter layer. The color filter layer is formed of a material that allows for the transmission of radiation (e.g., light) having a specific range of wavelength, while blocking light of wavelengths outside of the specified range. In some embodiments, the color filter 116 may be formed of a monomer, a polymer, or the like. In some embodiments, the color filter may be formed of a material having an index of refraction that is less than approximately 1.3, less than approximately 1.25, less than approximately 1.2, or other similar values.

Figure 20:
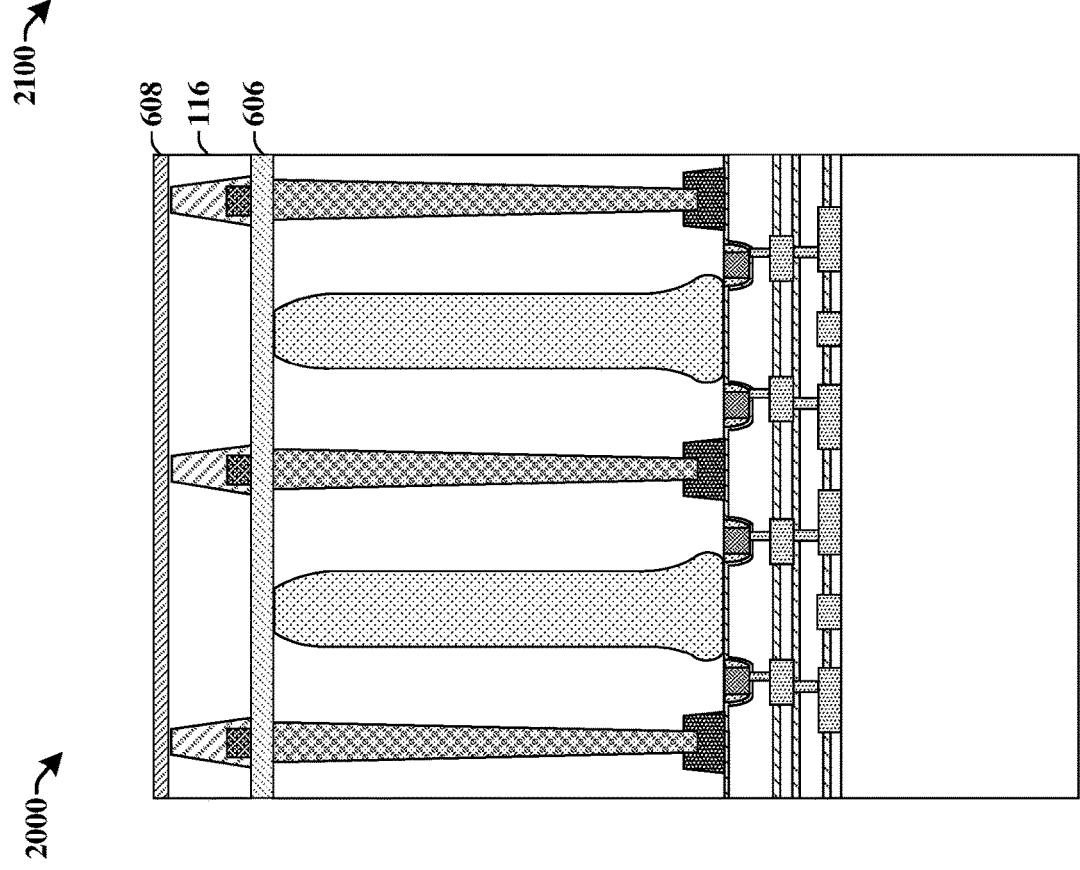

As shown in cross-sectional view 2000 of FIG. 20, a planarization structure 608 is formed over the color filter 116. The planarization structure 608 is formed to have a substantially flat upper surface facing away from the substrate. In some embodiments, the planarization structure 608 may comprise a polymer formed by way of a spin coating process.

Figure 21:
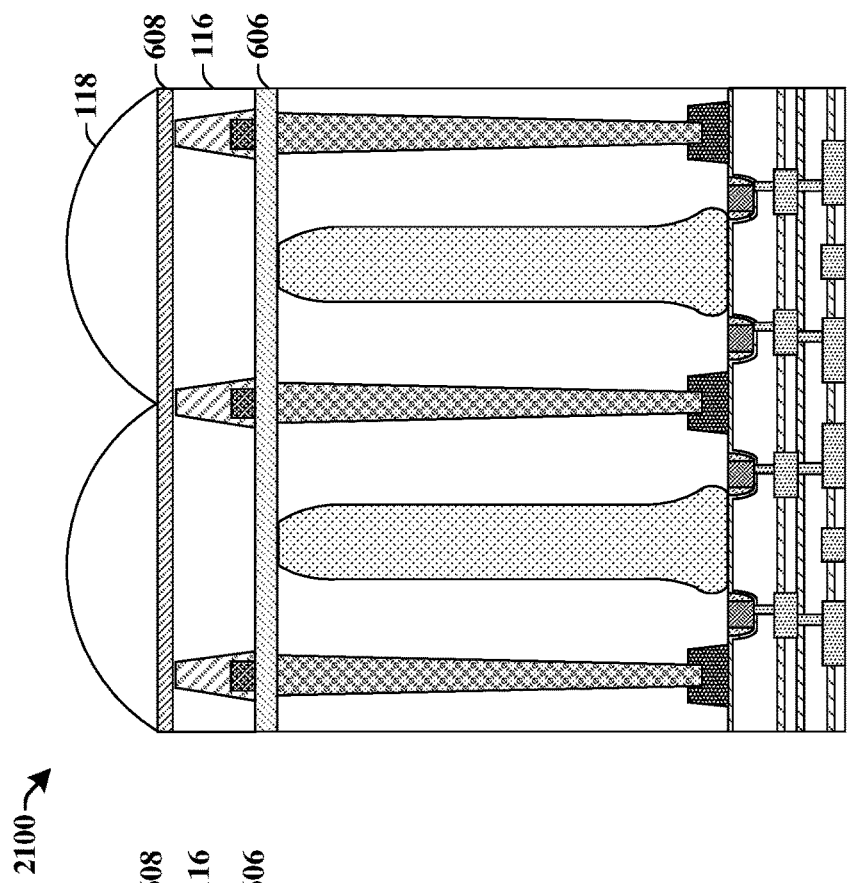

As shown in cross-sectional view 2100 of FIG. 21, a micro-lens 118 is formed over the color filter 116. In some embodiments, the micro-lens 118 may be formed by depositing a micro-lens material above the color filter 116 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The color filter 116 is then formed by selectively etching the micro-lens material according to the micro-lens template.

As also shown in cross-sectional view 2100 of FIG. 21, the support substrate (1402 of FIG. 14) is removed. In various embodiments, the support substrate may be removed by way of an etching process and/or a grinding process (e.g., a CMP process).

Figure 22:
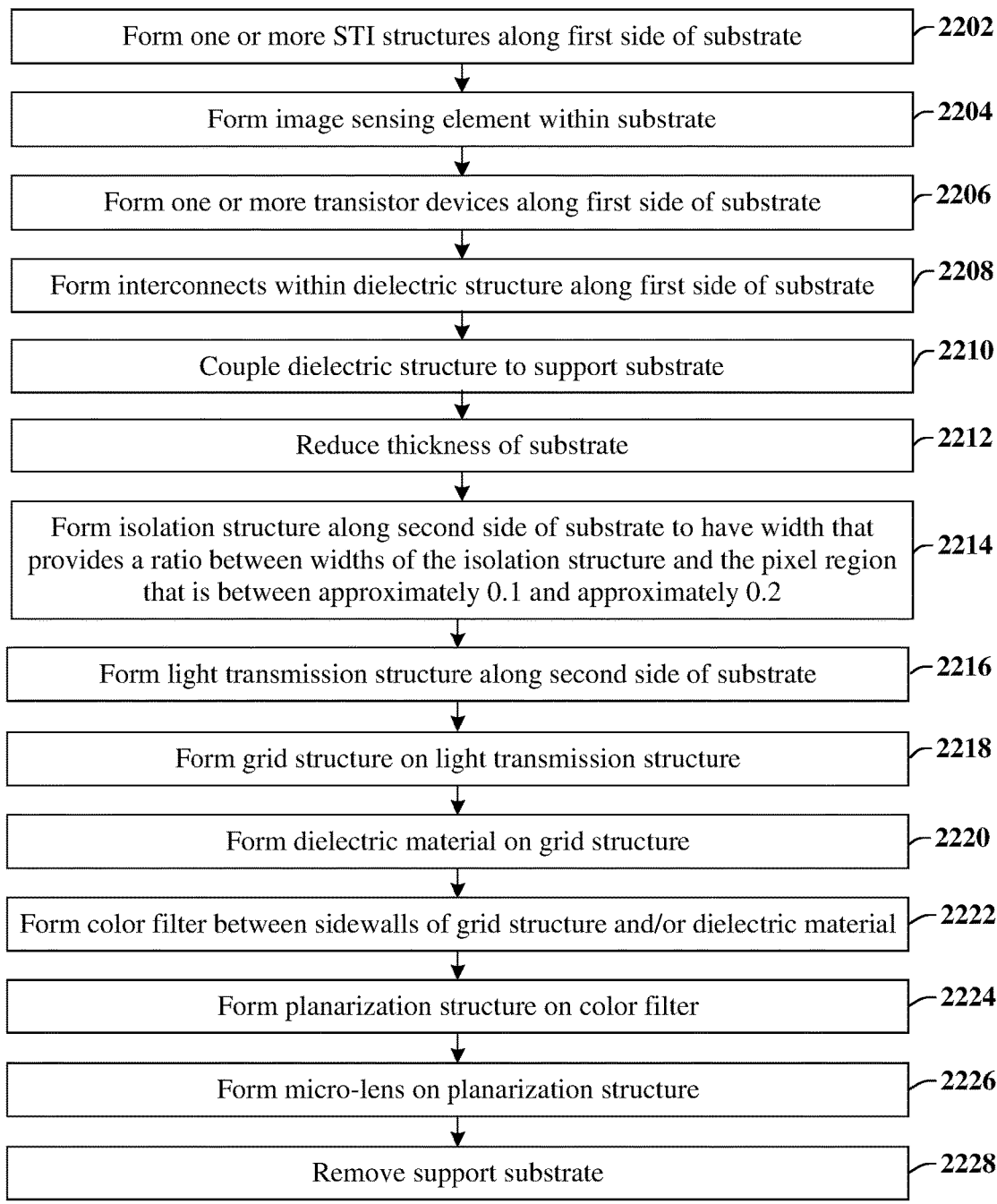
FIG. 22 illustrates a flow diagram of some embodiments of a method of forming an image sensor IC comprising a disclosed isolation structure.

FIG. 22 illustrates a flow diagram of some embodiments of a method 2200 of forming an image sensor integrated chip (IC) having an isolation structure configured to improve performance of the image sensor IC.

While method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, one or more shallow trench isolation (STI) structures are formed along a first side of a substrate. FIG. 10 illustrates a cross-sectional view 1000 of some embodiments corresponding to act 2202.

At 2204, one or more image sensing elements are formed within a substrate. FIG. 11 illustrates a cross-sectional view 1100 of some embodiments corresponding to act 2204.

At 2206, one or more transistor gate structures are formed along the first side of the substrate. FIG. 12 illustrates a cross-sectional view 1200 of some embodiments corresponding to act 2206.

At 2208, a plurality of interconnects are formed within a dielectric structure along the first side of the substrate. FIG. 13 illustrates a cross-sectional view 1300 of some embodiments corresponding to act 2208.

At 2210, the dielectric structure is coupled to a support substrate. FIG. 14 illustrates a cross-sectional view 1400 of some embodiments corresponding to act 2210.

At 2212, a thickness of the substrate is reduced. FIG. 14 illustrates a cross-sectional view 1400 of some embodiments corresponding to act 2212.

At 2214, an isolation structure is formed along a second side of substrate to have width that provides a ratio between widths of the isolation structure and the pixel region that is between approximately 0.1 and approximately 0.2. FIGS. 15-16 illustrate cross-sectional views 1500-1600 of some embodiments corresponding to act 2214.

At 2216, a light transmission structure is formed along a second side of the substrate. FIG. 17 illustrates a cross-sectional view 1700 of some embodiments corresponding to act 2216.

At 2218, a grid structure is formed on the light transmission structure. FIG. 17 illustrates a cross-sectional view 1700 of some embodiments corresponding to act 2218.

At 2220, a dielectric material is formed on the grid structure. FIG. 18 illustrates a cross-sectional view 1800 of some embodiments corresponding to act 2220.

At 2222, a color filter is formed between sidewalls of the grid structure and/or the dielectric material. FIG. 19 illustrates a cross-sectional view 1900 of some embodiments corresponding to act 2222.

At 2224, a planarization structure is formed on the color filter. FIG. 20 illustrates a cross-sectional view 2000 of some embodiments corresponding to act 2224.

At 2226, a micro-lens is formed on the planarization structure. FIG. 21 illustrates a cross-sectional view 2100 of some embodiments corresponding to act 2226.

At 2228, the support substrate is removed from the dielectric structure. FIG. 21 illustrates a cross-sectional view 2100 of some embodiments corresponding to act 2228.

Accordingly, in some embodiments, the present disclosure relates to an image sensing integrated chip having an isolation structure surrounding a pixel region comprising a first width that is less than or equal to approximately 0.7 microns. The isolation structure has a second width that is between approximately 10% and approximately 20% of the first width. The second width of the isolation structure is configured to improve a performance of an image sensing element within the pixel region by allowing incident radiation to be substantially confined between interior sidewalls of the isolation structure.

In some embodiments, the present disclosure relates to an image sensor integrated chip. The image sensor integrated chip includes a substrate having a first side and a second side opposing the first side, the substrate having one or more sidewalls defining a trench extending along opposing sides of a pixel region having a first width; an isolation structure including one or more dielectric materials disposed within the trench, the isolation structure having a second width; an image sensing element disposed within the pixel region; a focal region disposed within the pixel region, the focal region configured to receive incident radiation along the second side of the substrate; and a ratio of the second width to the first width being in a range of between approximately 0.1 and approximately 0.2, so that the focal region is completely confined between interior sidewall of the isolation structure facing the image sensing element. In some embodiments, the focal region extends to an outer boundary that contacts the isolation structure on opposing sides of the focal region. In some embodiments, the focal region is closer to the isolation structure along a first direction than along a second direction that is rotated at approximately 45° with respect to the first direction. In some embodiments, the image sensor integrated chip further includes a shallow trench isolation (STI) structure disposed along the first side of the substrate and having a surface facing the substrate, the surface laterally extends past opposing edges of the isolation structure. In some embodiments, the first width is less than or equal to approximately 0.7 microns. In some embodiments, the second width is less than or equal to approximately 140 nanometers. In some embodiments, the image sensor integrated chip further includes a micro-lens having a curved surface facing away from the substrate, the curved surface being configured to focus the incident radiation into the focal region. In some embodiments, the focal region is separated from the isolation structure along a first direction and along a second direction that is perpendicular to the first direction, the first direction and the second direction parallel to the second side of the substrate.

In other embodiments, the present disclosure relates to an image sensor integrated chip. The image sensor integrated chip includes an image sensing element arranged within a pixel region of a semiconductor substrate, the pixel region having first width that is less than approximately 0.7 microns; an isolation structure arranged along a back-side of the semiconductor substrate, the isolation structure surrounding the image sensing element; a micro-lens arranged along the back-side of the semiconductor substrate and configured to focus incident radiation onto a focal region arranged along the back-side of the semiconductor substrate; and the focal region being separated from the isolation structure by a non-zero distance. In some embodiments, the image sensor integrated chip further includes one or more transistor gate structures disposed along a front-side of the semiconductor substrate; and a shallow trench isolation (STI) structure disposed along the front-side of the semiconductor substrate below the isolation structure. In some embodiments, the STI structure has a surface facing the semiconductor substrate, the surface laterally extending past opposing edges of the isolation structure. In some embodiments, the isolation structure extends along one or more sidewalls of the STI structure. In some embodiments, the isolation structure is vertically separated from the STI structure by a second non-zero distance that extends through the semiconductor substrate. In some embodiments, the isolation structure has a second width that decreases as a distance from the back-side of the semiconductor substrate increases. In some embodiments, the isolation structure has a second width that increases as a distance from the back-side of the semiconductor substrate increases. In some embodiments, the focal region laterally overlaps the isolation structure. In some embodiments, the focal region extends to a third non-zero distance over the isolation structure, the third non-zero distance being less than or equal to approximately 10% of a second width of the isolation structure.

In yet other embodiments, the present disclosure relates to a method of forming image sensor integrated chip. The method includes forming an image sensing element within a pixel region of a substrate, the substrate having a first side and a second side and the pixel region having a first width; selectively etching the second side of the substrate to define one or more trenches; forming one or more dielectric materials within the one or more trenches to form an isolation structure having a second width; and a ratio of the second width to the first width being in a range of between approximately 0.1 and approximately 0.2. In some embodiments, the first width is less than or equal to approximately 0.7 microns. In some embodiments, the method further includes forming one or more shallow trench isolation (STI) structures along the first side of the substrate, the one or more trenches extending into the one or more STI structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor integrated chip, comprising:
    forming an image sensing element within a pixel region of a substrate, the substrate having a first side and a second side;
    selectively etching the second side of the substrate to define one or more trenches;
    forming one or more dielectric materials within the one or more trenches to form an isolation structure having a second width, wherein the pixel region has a first width that is measured between an outer sidewall of the one or more dielectric facing away from the image sensing element and a sidewall of the substrate facing the isolation structure, the first width being less than or equal to approximately 0.7 microns; and
    wherein a ratio of the second width to the first width is in a range of between approximately 0.1 and approximately 0.2.

2. The method of claim 1, wherein a micro-lens is disposed over the substrate and configured to focus incident radiation onto a focal region that is within the pixel region, the focal region laterally extending past a part of the image sensing element and not laterally overlapping the isolation structure.

3. A method of forming an image sensor integrated chip, comprising:
    forming an image sensing element within a pixel region of a substrate, the substrate having a first side and a second side, wherein the pixel region has a first width that is less than or equal to approximately 0.7 microns, and wherein a top of the image sensing element has a top width and a bottom of the image sensing element has a bottom width that is smaller than the top width;
    forming an isolation structure having a second width within the substrate, wherein the isolation structure wraps around the pixel region in a continuous and unbroken loop and vertically extends from the second side of the substrate to within the substrate; and
    wherein a micro-lens is disposed over the substrate and configured to focus incident radiation onto a focal region that is within the pixel region and that does not laterally overlap the isolation structure, the focal region being laterally confined within the top width and laterally extending past the bottom width.

4. The method of claim 3, wherein a ratio of the second width to the first width is in a range of between approximately 0.1 and approximately 0.2.

5. The method of claim 3, wherein the focal region extends to an outer boundary that contacts the isolation structure on opposing sides of the focal region.

6. The method of claim 3, wherein the focal region is closer to the isolation structure along a first direction than along a second direction that is rotated at approximately 45° with respect to the first direction.

7. The method of claim 3, wherein the second width is less than or equal to approximately 140 nanometers.

8. The method of claim 3, further comprising:
    forming a grid structure along the second side of the substrate;
    forming a dielectric material over the grid structure; and
    forming a color filter along a sidewall of the dielectric material and directly over the image sensing element.

9. The method of claim 8, further comprising:
    forming the micro-lens on the color filter, wherein the micro-lens has a curved surface facing away from the substrate, the curved surface being configured to focus the incident radiation onto the focal region.

10. The method of claim 9, wherein the focal region is separated from the isolation structure along a first direction and along a second direction that is perpendicular to the first direction, the first direction and the second direction parallel to the second side of the substrate.

11. A method of forming an image sensor integrated chip, comprising:
   forming an image sensing element within a pixel region of a substrate;
   forming a transistor device along a first side of the substrate;
   forming an isolation structure having a second width within a second side of the substrate opposing the first side of the substrate, wherein the pixel region has a first width that is measured between an outer sidewall of the isolation structure facing away from the image sensing element and a sidewall of the substrate facing the isolation structure, the first width being less than or equal to approximately 0.7 microns, and wherein the isolation structure wraps around the pixel region in a continuous and unbroken loop, and wherein a ratio of the second width to the first width is in a range of between approximately 0.1 and approximately 0.2;
   forming a grid structure along the second side of the substrate;
   forming a dielectric material over the grid structure and along opposing sidewalls of the grid structure;
   forming a color filter along a sidewall of the dielectric material; and
   forming a micro-lens on the color filter, wherein the micro-lens has a curved surface facing away from the substrate, the micro-lens having a numerical aperture of between approximately 0.3 and 0.75 that focuses incident radiation into a focal region that is within the pixel region and laterally outside of the isolation structure.

12. The method of claim 11, wherein the focal region extends to an outer boundary that contacts the isolation structure on opposing sides of the focal region along a first direction and wherein the focal region is separated from the isolation structure along a second direction that is rotated at approximately 45° with respect to the first direction as viewed in a plan-view.

13. The method of claim 11, wherein the second width is less than or equal to approximately 140 nanometers.

14. The method of claim 11,
   wherein the dielectric material contacts the opposing sidewalls of the grid structure from a bottommost surface of the grid structure to a topmost surface of the grid structure; and
   wherein the color filter contacts the sidewall of the dielectric material from a bottommost surface of the dielectric material to a topmost surface of the dielectric material.

15. The method of claim 11, wherein the dielectric material comprises a porous dielectric material having a density of less than approximately 1.5 $g/m^3$.

16. The method of claim 3, wherein the image sensing element transitions between the top width and the bottom width above a bottom of the isolation structure.

17. The method of claim 11, wherein the focal region is laterally separated from the isolation structure by a distance that is in a range of between approximately 0 nanometers and approximately 50 nanometers.

18. The method of claim 11,
   wherein the focal region is separated from an inner sidewall of the isolation structure that faces the image sensing element by a first distance that is smaller than a second distance between the focal region and a corner of the isolation structure; and
   wherein the first distance is in a range of between approximately 0 nm (nanometers) and approximately 50 nm and the second distance is in a range of between approximately 10 nm and approximately 250 nm.

19. The method of claim 11, wherein an outermost boundary of the image sensing element is laterally separated from the isolation structure by a non-zero distance.

20. The method of claim 11, further comprising:
   forming one or more interconnects within an inter-level dielectric (ILD) structure formed onto the substrate, wherein the focal region has a greater width than a bottom of the image sensing element that faces the one or more interconnects.

* * * * *